United States Patent
Chang et al.

(10) Patent No.: US 6,782,519 B2
(45) Date of Patent: Aug. 24, 2004

(54) CLOCK TREE SYNTHESIS FOR MIXED DOMAIN CLOCKS

(75) Inventors: Jui-Ming Chang, San Jose, CA (US); Chin-Chi Teng, Sunnyvale, CA (US); Wei-Jin Dai, Cupertino, CA (US)

(73) Assignee: Cadence Design Systems, Inc., San Jose, CA (US)

(*) Notice: Subject to any disclaimer, the term of this patent is extended or adjusted under 35 U.S.C. 154(b) by 199 days.

(21) Appl. No.: 10/231,532

(22) Filed: Aug. 29, 2002

(65) Prior Publication Data

US 2003/0182634 A1 Sep. 25, 2003

Related U.S. Application Data

(60) Provisional application No. 60/342,008, filed on Dec. 18, 2001.

(51) Int. Cl.[7] .................................................. G06F 9/45
(52) U.S. Cl. .............................................. 716/6; 716/10
(58) Field of Search ............................... 716/1, 2, 4, 5, 716/6, 7, 8, 9, 10, 11, 18

(56) References Cited

U.S. PATENT DOCUMENTS

| | | | | |
|---|---|---|---|---|
| 5,638,291 A | * | 6/1997 | Li et al. ........................ | 716/18 |
| 6,487,707 B1 | * | 11/2002 | Kamiya ........................ | 716/8 |
| 6,502,222 B1 | * | 12/2002 | Tetelbaum .................... | 716/4 |
| 2001/0010092 A1 | * | 7/2001 | Kato ........................... | 716/10 |

OTHER PUBLICATIONS

Chi et al., "A Reliable Clock Tree Design Methodology for ASIC Designs," Proc. IEEE First Int'l Symposium on Quality Electronic Design, Mar. 2000, 6 pages.*

Erdal et al., "An Implementation of a Clock–Tree Distribution Scheme for High–Performance ASICs," Proc. 5th Annual IEEE Int'l ASIC Conference and Exhibit, Sep. 1992, pp. 26–29.*

Minami et al., "Clock Tree Synthesis Based on RC Delay Balancing." IEEE 1992 Custom ICs Conference, pp. 28.3.1–28.3.4.*

* cited by examiner

*Primary Examiner*—Leigh M. Garbowski
(74) *Attorney, Agent, or Firm*—Daniel J. Bedell; Smith-Hill and Bedell

(57) ABSTRACT

A clock tree syntheses (CTS) tool designs a group of clock trees to be incorporated into an IC design for conveying separate clock signals to clock sinks within the IC with a predetermined maximum group skew. The tool initially generates a separate, independently balanced, first clock tree design for each clock tree and then processes each first clock tree design to estimate an average path delay of the clock signal it conveys to each sink. The CTS tool then selects, as a target path delay, a highest average delay from among average delays computed for all clock trees. Thereafter the CTS tool generates a separate second clock tree design for each clock tree that is balanced to limit a difference between the target path delay and an estimated delay to each sink to a value that ensures a group clock skew will reside within the predetermined maximum group skew.

14 Claims, 2 Drawing Sheets

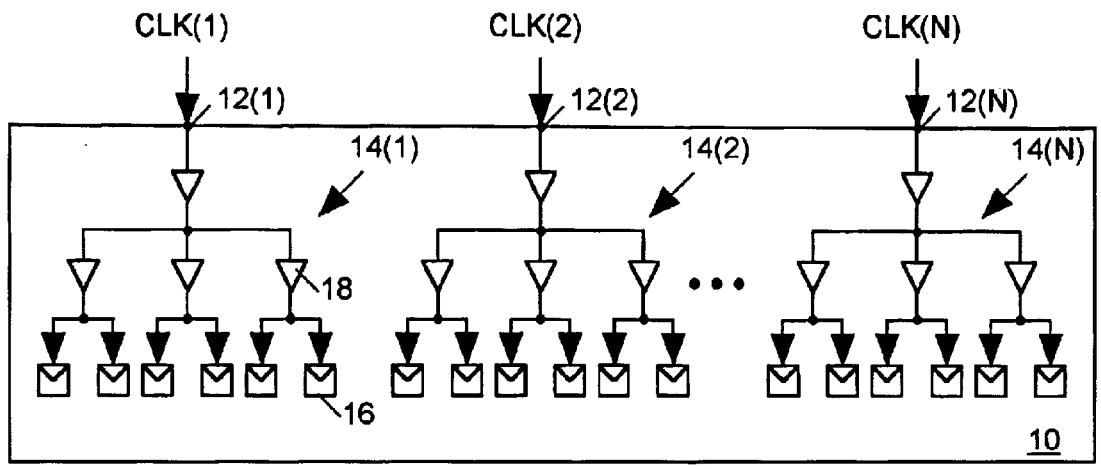
FIG. 1
(PRIOR ART)
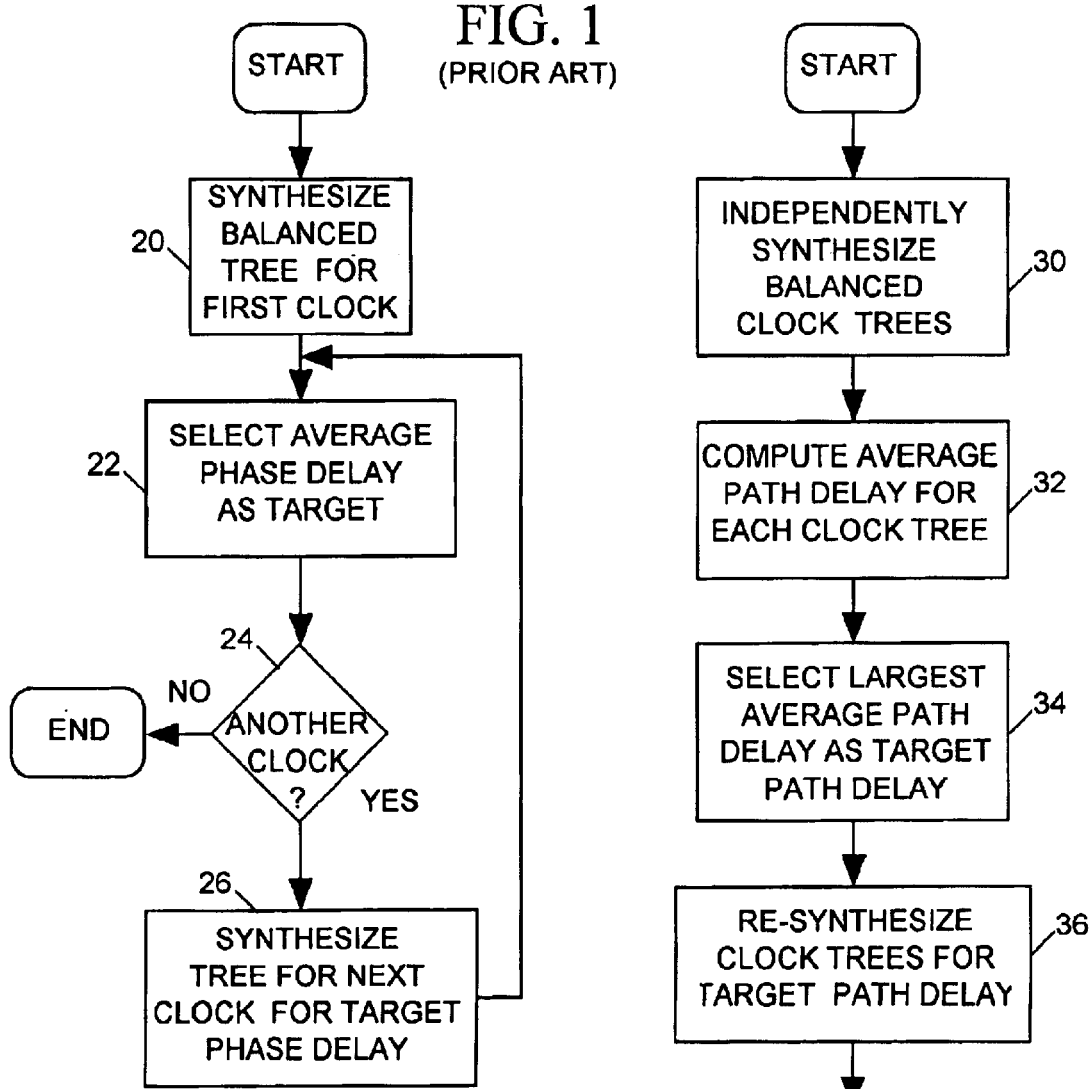
FIG. 2
(PRIOR ART)
FIG. 3

CLOCK TREE SYNTHESIS FOR MIXED DOMAIN CLOCKS

CROSS-REFERENCE TO RELATED APPLICATIONS

This application claims the benefit of the filing date of U.S. Provisional Application No. 60/342,008, filed Dec. 18, 2001.

BACKGROUND OF THE INVENTION

1. Field of the Invention

The present invention relates in general to computer-aided design (CAD) tools for generating integrated circuit (IC) layouts, and in particular to a method implemented by an IC layout CAD tool for synthesizing mixed domain clock trees.

2. Description of Related Art

A typical digital IC includes large numbers of clocked devices ("clock sinks" or "sinks") such as flip-flops, registers and latches that change state in response to clock signal pulses, and the IC synchronizes state changes in a group of sinks by clocking them with the same clock signal. The IC employs a clock tree, a branching network of conductor and buffers, to fan out a clock signal arriving at one of its input terminals to all of the sinks that are clocked by that clock signal. Given the positions of the sinks within an IC layout, a clock tree synthesis (CTS) tool automatically designs a clock tree for distributing a clock signal to the sinks. A typical CTS tool will initially lay out the conductors forming the clock tree in a way that tries to equalize the distance the clock signal must travel to each sink from an IC input terminal receiving the clock signal from an external source. The CTS tool places buffers (amplifiers) at branch points of the tree sized as necessary to drive all of the buffers or sinks downstream of the branch point. Based on an estimate of the signal path delay in each branch of the clock tree, the CTS tool then "balances" the clock tree by inserting addition buffers in selected branches of the clock tree to adjust the path delays within those branches to ensure that the clock tree will deliver each clock signal pulse to every sink at nearly the same time. Such balancing of the clock tree helps to minimize the difference ("skew" between arrival times of each clock signal pulse at any two sinks.

Inserting a buffer into a clock tree can either increase or decrease signal path delays through the clock tree. Each buffer has an inherent delay which can add to the path delay though the clock tree. But a large buffer producing a large output current can reduce path delay by increasing a rate at which capacitance of clock tree conductors downstream of the buffer is charged. Thus depending on the size and buffer of a buffer inserted within a clock tree, the buffer can either reduce or increase signal path delay through the clock tree. A CTS tool can therefore balance a clock tree by appropriately selecting the number, sizes and positions of buffers it inserts into each branch of the clock tree. Since only a limited range of buffer sizes are available, a CTS tool normally cannot size and place buffers to totally eliminate clock signal skew, but it can keep clock signal skew within some specified acceptable limit.

In a "mixed domain" IC, groups of sinks are separately clocked by different clock signals. FIG. 1 depicts a prior art mixed domain IC 10 having N clock signal inputs CLK(1)–CLK(N) at IC pins 12 and providing a separate clock tree 14(1)–14(N) for delivering each clock signal to the set of sinks 16 residing with that clock signal's domain. In the past, an IC designer specified a maximum allowable skew between arrival times of edges of sinks within each clock domain, and a CTS tool sizes and positions each buffer 18 within each clock tree 14 to limit clock skew within each clock domain to the specified maximum for that domain. A CTS tool could therefore independently design a balanced each clock tree 14 because it is necessary only to satisfy maximum skew constraints for paths to sinks 16 within the same clock domain. Timing skew between paths to sinks 16 residing in different clock domains was not of concern.

In recent years IC designers have begun to assign two or more separate clock signals to the same "clock group" and to try to design clock trees of the same clock group so that a skew between edges of clock signals within the same clock group (i.e. the "group skew') is limited to a specified maximum. For example a designer might assign clocks CLK(1) and CLK(2) of FIG. 1 to the same clock group, and might want to limit the difference between the path delay of an edge of a clock signal CLK(1) traveling from input pin 12(1) to any given sink 16 within its domain via clock tree 14(1) and the path delay of an edge of a clock signal CLK(2) traveling from input pin 12(2) to any given sink 16 via a clock tree 14(2) to some predetermined maximum allowable group skew. Under such a constraint, a CTS tool that designs clock trees can no longer independently balance them.

As illustrated in FIG. 2, to meet a group skew constraint, a prior art CTS tool synthesizes a balanced clock tree for a first one of the clocks within a group so as to minimize the skew within that clock signal's domain (step 20). The CTS tool then computes an average path delay between the IC pin receiving that first clock signal and all sinks receiving edges of the first clock signal and establishes that average path delay as a target path delay for a next clock tree of the group to be synthesized (step 22). When the clock group includes another clock signal for which a clock tree has not yet been synthesized (step 24), the CTS tool synthesizes a clock tree for that clock signal and adjusts path delays within its branches so that the total transit time between that clock signal's input terminal and every sink in its domain matches the target path delay as closely as possible. The average path delay for all sinks in the domains of the two synthesized clock trees is then computed (stem 22) and established as a target path delay for a next clock tree of the group to be synthesized at step 26. The process continues until the CTS tool has synthesized clock trees for all clock signals of the group.

The ability of the prior art approach to keep group skew within acceptable limits is highly dependent on the order in which the CTS tool synthesizes the clock trees. For example if the average path delay for the first clock tree to be synthesized it too short, it may not be possible to synthesize a next clock tree of the group having an average path delay very close to that of the first clock tree to be synthesized. It may be necessary for a CTS tool implementing the method to repeat the synthesis process of FIG. 2 several times, choosing a different order in which to synthesize the clock trees during each repetition or the process, until it discovers an order resulting in an acceptable group skew.

What is needed is a quicker method for synthesizing a balanced group of clock trees having an acceptably limited group skew in a manner in which success does not depend on an order in which the clock trees are synthesized.

BRIEF SUMMARY OF THE INVENTION

The invention relates to a method for synthesizing and balancing two or more separate clock trees assigned to the same clock group so as to keep group clock skew within a predetermined maximum limit. In accordance with the invention, a clock tree synthesis (CTS) tool initially generates a separate, independently balanced, first clock tree design specifying each clock tree. The CTS tool then processes the first clock tree design for each clock tree to estimate an average delay the clock signal it is to convey will experience as the clock signal passes through the clock tree to each sink receiving that clock signal. The CTS tool then selects, as a target path delay, a highest average delay from among average delays computed for all clock trees. Thereafter the CTS tool generates a separate second clock tree design for each clock tree that is balanced to limit a difference between the target path delay and an estimated delay to each sink to a value that ensures the group clock skew will reside within the predetermined maximum group skew limit.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWINGS

FIG. 1 is a schematic diagram depicting a group of clock trees formed within a mixed domain integrated circuit, FIG. 2 is a flow chart illustrating a prior art method for synthesizing a group of clock trees, FIG. 3 is a flow chart illustrating a method for synthesizing a group of clock trees in accordance with the invention.

DETAILED DESCRIPTION OF THE INVENTION

Figure 4:
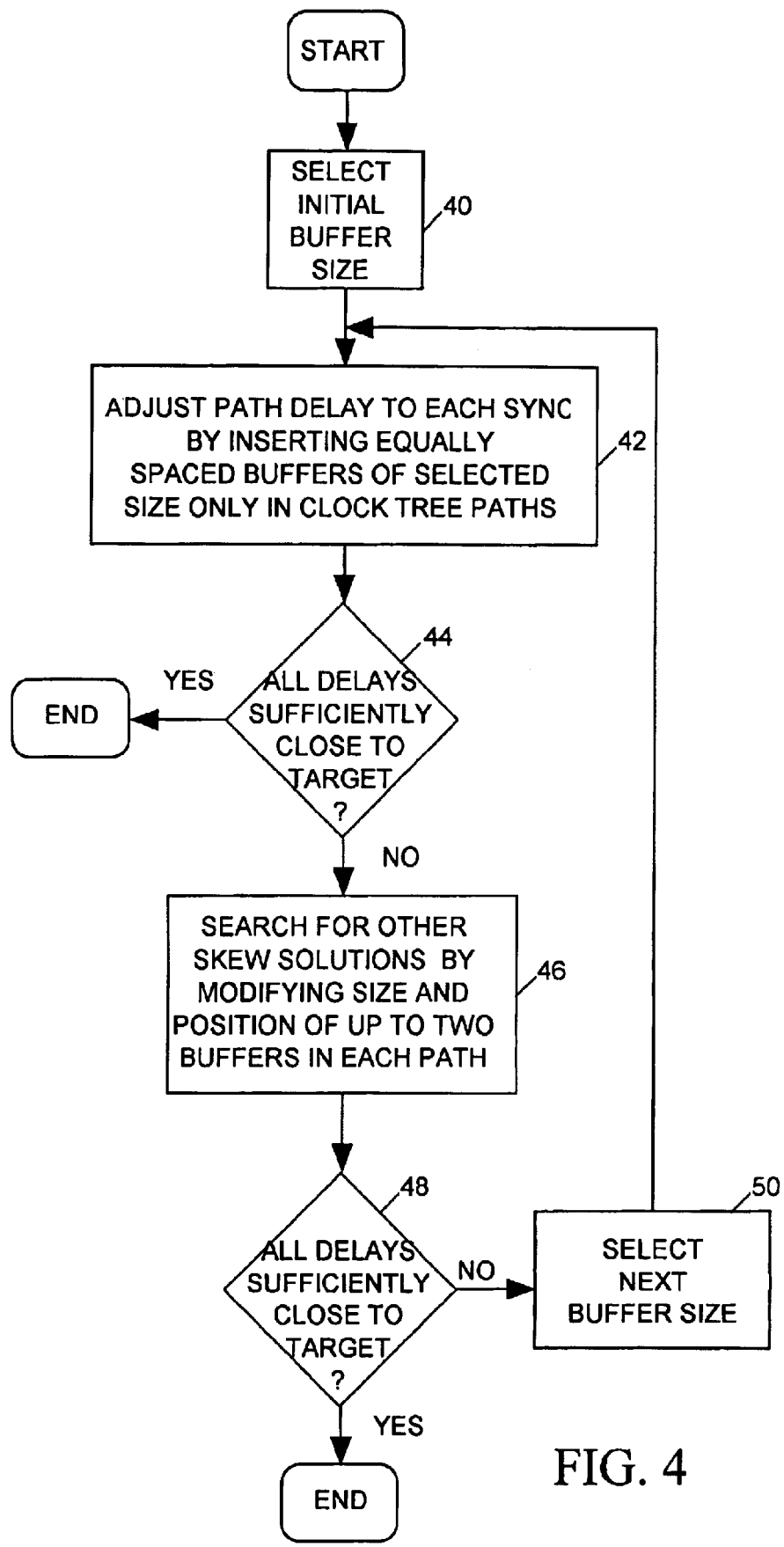
FIG. 4 is a flow chart illustrating substeps of one the steps of the method of FIG. 3.

FIG. 1 is a schematic diagram depicting a group of N clock trees 14(1)–14(N) formed within a mixed domain integrated circuit (IC) 10, each of which delivers a corresponding clock signal CLK(1)–CLK(N) arriving at a separate one of IC pin 12(1)–12(N) to a separate group of clocked devices ("clock sinks" or "sinks") 16, including, for example, flip-flops, registers and latches. Each clock tree 14(1)–14(N) is formed by a branching network of conductors and buffers 18. IC designers sometimes want all N clock trees 14(1)–14(N) of the group to have substantially similar path delays between their corresponding input pins 12(1) –12(N) and every one of sinks 16, with any variation in path delay (group skew) being within some specified maximum group skew limit.

The invention relates to a method that may be employed by a clock tree synthesis (CTS) tool for synthesizing a group of clock trees for an IC in a manner that keeps group skew within a specified limit. The method is suitably incorporated into software stored on computer readable media which, when read and executed by a conventional computer, causes the computer to act as a clock tree synthesis (CTS) tool. Suitable computer-readable media for storing the debugger instruction include, but are not limited to, compact disks, floppy disks, hard disks, and random access or read only memory.

A CTS tool in accordance with the invention "balances" a clock tree by inserting buffers in selected branches of the clock tree to adjust the path delays within those branches to ensure that the clock tree will deliver each clock signal pulse to every sink with as nearly as possible the same delay.

Inserting a buffer into a clock tree can either increase or decrease signal path delays through the clock tree. Each buffer has an inherent delay which can add to path delays though the clock tree. But a large buffer producing a large output current can reduce path delay by increasing a rate at which capacitance of clock tree conductors downstream of the buffer is charged. Thus depending on the size and position a buffer inserted within a clock tree, the buffer can either reduce or increase signal path delay through the clock tree. The CTS tool balances the clock trees by appropriately selecting the number, sizes and positions of buffers, if any, it inserts into each clock tree branch.

FIG. 3 illustrates the method in accordance with the invention for synthesizing a group of clock trees included within an IC layout wherein path delays within the clock trees are adjusted to keep group clock skew within a predetermined maximum limit. Initially all clock trees are independently synthesized using any suitable conventional clock tree synthesis method to produce an independently balanced, first design for each clock tree (step 30). The CTS tool "independently" balances each first clock tree design in the sense that it designs the clock tree to minimize clock skew within that clock tree, but does not take into account group clock skew when designing the clock tree.

The CTS tool then computes the average clock signal path delay from the IC clock input pin that receives a clock signal to each sink within each clock tree (step 32), and thereafter selects the largest average path delay among all clock trees as a "target path delay" (step 34). All clock trees are then re-synthesized, with the clock trees being balanced in a way that adjusts the clock signal path delay from each clock signal's input terminal to each clock sink so that it is sufficiently close to the target path delay (step 36).

FIG. 4 details step 36 of FIG. 3. The CTS tool carrying out step 36 first selects one buffer size (step 40) and then sets the path delay to each sink as close as possible to the target delay by inserting an appropriate number of buffers of the selected size equally spaced along selected paths of the tree (step 42). The CTS tool then determines whether the path delay between the clock input terminal and each sink linked to that terminal is acceptably close to the target path delay, such that the difference between the target delay and the path delay is, for example, less than one half of the maximum allowable group skew (step 44). The clock tree balancing process ends following step 44 if the path delay for every sink in the tree is acceptably close to the target path delay.

However when the path delay to at least one sink is not acceptably close to the target path delay, the CTS tool searches for an acceptable balancing solution by incrementally modifying the size and/or position of up to two buffers in each path (step 46). If the CTS tool finds a solution for which the path delay for every sink in the tree is acceptably close to the target path delay (step 48), the clock tree balancing process ends. However when the path delay to at least one sink of a given tree is still not acceptably close to the target path delay, the CTS selects a next buffer size (step 50) and repeats the process starting at step 42. The process continues to loop though steps 42–50, with the CTS tool trying various combinations of buffer sizes and positions until it finds at step 44 or 48 that all path delays are acceptably close to the target path delay.

When all clock trees have been resynthesized in this manner, the absolute value of the difference between the target path delay and the computed path delay for each clock input terminal-to-sink path will be within one-half of the maximum allowable group skew. The group skew will therefore be less than or equal to the maximum allowable group skew.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. A method for designing a plurality of clock trees to be incorporated into an integrated circuit (IC) for delivering a plurality of clock signals to a plurality of sinks to be incorporated into the IC, wherein each clock tree is to include a root node and is to convey a corresponding one of the plurality of clock signals from its root node to a separate, corresponding subset of said plurality of sinks wherein the method comprises the steps of:
   a. generating a plurality of independently balanced first clock tree designs, each describing a first layout within the IC of a separate corresponding one of said plurality of clock trees;
   b. processing said plurality of first clock tree designs to estimate a plurality of average delays, each corresponding to a separate one of the plurality clock trees and being an average clock signal delay between its corresponding clock tree's root node and sinks of the corresponding clock tree's corresponding subset of sinks;
   c. selecting, as a target path delay, a highest average delay from among the plurality of average delays estimated at step b; and
   d. generating a plurality of second clock tree designs, each describing a second layout within the IC of a separate corresponding one of said plurality of clock trees, each of the plurality of second clock tree designs being balanced to limit differences between the target path delay and estimated delays between its corresponding clock tree's root node and the corresponding subtree's corresponding subset of sinks.

2. The method in accordance with claim 1 wherein step d comprises the substeps of:
   d1. selecting a buffer size; and
   d2. generating said plurality of second clock tree designs, each describing the second layout within the IC of its corresponding one of said plurality of clock trees as including a plurality of branches, with buffers of the selected buffer size being included in selected branches of the second clock trees so as to limit differences between the target path delay and estimated clock signal delays between the clock trees' root nodes and their corresponding subsets of sinks.

3. The method in accordance with claim 2 further comprising the step of:
   d3. modifying at least one of the plurality of second clock tree designs to adjust positions of buffers within selected branches of its corresponding clock tree to reduce a difference between the target path delay and an estimated path delay between the clock tree's root node and at least one sink of its corresponding subset of sinks.

4. The method in accordance with claim 2 further comprising the step of:
   d3. modifying at least one of the plurality of second clock tree designs to adjust sizes of buffers within the selected branches of its corresponding clock tree to reduce a difference between the target path delay and an estimated path delay between the clock tree's root node and at least one sink of its corresponding subset of sinks.

5. The method in accordance with claim 4 further comprising the step of:
   d4. modifying at least one of the plurality of second clock tree designs to adjust positions of buffers within selected branches of its corresponding clock tree to reduce a difference between the target path delay and an estimated path delay between the clock tree's root node and at least one sink of its corresponding subset of sinks.

6. The method in accordance with claim 5 wherein the sizes and positions of the buffers included within the selected branches of the clock tree corresponding to the at least one second clock tree design are adjusted to limit a difference between the target path delay and an estimated path delay between the clock tree's root node and at least one sink of its corresponding subset of sinks to a predetermined maximum value.

7. The method in accordance with claim 2 wherein the sizes of the buffers included within the selected branches are adjusted to limit a difference between the target path delay and an estimated path delay to a predetermined maximum value.

8. Computer readable media which, when read and executed by a computer, causes the computer to carry out a method for designing a plurality of clock trees to be incorporated into an integrated circuit (IC) for delivering a plurality of clock signals to a plurality of sinks to be incorporated into the IC, wherein each clock tree is to include a root node and is to convey a corresponding one of the plurality of clock signals from its root node to a separate, corresponding subset of said plurality of sinks wherein the method comprises the steps of:
   a. generating a plurality of independently balanced first clock tree designs, each describing a first layout within the IC of a separate corresponding one of said plurality of clock trees;
   b. processing said plurality of first clock tree designs to estimate a plurality of average delays, each corresponding to a separate one of the plurality clock trees and being an average clock signal delay between its corresponding clock tree's root node and sinks of the corresponding clock tree's corresponding subset of sinks;
   c. selecting, as a target path delay, a highest average delay from among the plurality of average delays estimated at step b; and
   d. generating a plurality of second clock tree designs, each describing a second layout within the IC of a separate corresponding one of said plurality of clock trees, each of the plurality of second clock tree designs being balanced to limit differences between the target path delay and estimated delays between its corresponding clock tree's root node and the corresponding subtree's corresponding subset of sinks.

9. The computer readable media in accordance with claim 8 wherein step d comprises the substeps of:
   d1. selecting a buffer size; and
   d2. generating said plurality of second clock tree designs, each describing the second layout within the IC of its corresponding one of said plurality of clock trees as including a plurality of branches, with buffers of the selected buffer size being included in selected branches of the second clock trees so as to limit differences between the target path delay and estimated clock signal delays between the clock trees' root nodes and their corresponding subsets of sinks.

10. The computer-readable media in accordance with claim 9 wherein the method further comprises the step of:

d3. modifying at least one of the plurality of second clock tree designs to adjust positions of buffers within selected branches of its corresponding clock tree to reduce a difference between the target path delay and an estimated path delay between the clock tree's root node and at least one sink of its corresponding subset of sinks.

11. The computer-readable media in accordance with claim 9 wherein the method further comprises the step of:

d3. modifying at least one of the plurality of second clock tree designs to adjust sizes of buffers within the selected branches of its corresponding clock tree to reduce a difference between the target path delay and an estimated path delay between the clock tree's root node and at least one sink of its corresponding subset of sinks.

12. The computer readable media in accordance with claim 11 wherein the method further comprises the step of:

d4. modifying at least one of the plurality of second clock tree designs to adjust positions of buffers within selected branches of its corresponding clock tree to reduce a difference between the target path delay and an estimated path delay between the clock tree's root node and at least one sink of its corresponding subset of sinks.

13. The computer readable media in accordance with claim 12 wherein the sizes and positions of the buffers included within the selected branches of the clock tree corresponding to the at least one second clock tree design are adjusted to limit a difference between the target path delay and an estimated path delay between the clock tree's root node and at least one sink of its corresponding subset of sinks to a predetermined maximum value.

14. The computer readable media in accordance with claim 9 wherein the sizes of the buffers included within the selected branches are adjusted to limit a difference between the target path delay and an estimated path delay to a predetermined maximum value.

* * * * *